United States Patent [19]

Bok

[11] Patent Number: 4,620,997

[45] **Date of Patent: * Nov. 4, 1986**

[54] METHOD FOR COATING SUBSTRATES

[75] Inventor: Edward Bok, Badhoevedorp, Netherlands

[73] Assignee: Integrated Automation Limited, Road Town, British Virgin Isls.

[ * ] Notice: The portion of the term of this patent subsequent to Dec. 24, 2002 has been disclaimed.

[21] Appl. No.: 695,722

[22] PCT Filed: Feb. 20, 1984

[86] PCT No.: PCT/NL84/00005

§ 371 Date: Oct. 10, 1984

§ 102(e) Date: Oct. 10, 1984

[87] PCT Pub. No.: WO84/03238

PCT Pub. Date: Aug. 30, 1984

[30] Foreign Application Priority Data

Feb. 21, 1983 [NL] Netherlands ......................... 8300649

[51] Int. Cl.[4] .......................... B05D 1/18; B44C 1/22; C23C 16/00

[52] U.S. Cl. ................................ 427/434.3; 118/411; 118/412; 156/345; 156/646; 226/97; 406/86; 427/434.5; 427/255.5

[58] Field of Search .................. 118/50, 62, 411, 412; 427/337, 286, 348, 372.2, 378, 424, 9, 294, 255.5, 434.3, 434.5; 226/97; 406/86; 156/345, 646

[56] References Cited

U.S. PATENT DOCUMENTS

| | | | |
|---|---|---|---|
| 2,848,820 | 8/1958 | Wallin et al. | 34/23 |
| 3,588,176 | 6/1971 | Byrne et al. | 302/2 |
| 4,127,945 | 12/1978 | Nothen et al. | 34/18 |
| 4,292,745 | 10/1981 | Caratsch | 34/156 |
| 4,341,592 | 7/1982 | Shortes et al. | 156/643 |
| 4,406,388 | 9/1983 | Takashi et al. | 34/156 |
| 4,480,777 | 11/1984 | Suzuki et al. | 226/97 |
| 4,495,024 | 1/1985 | Bok | 156/646 |
| 4,521,268 | 6/1985 | Bok | 156/345 |
| 4,544,446 | 10/1985 | Cady | 156/639 |
| 4,560,590 | 12/1985 | Bok | 427/294 |
| 4,575,408 | 3/1986 | Bok | 204/192 E |
| 4,576,109 | 3/1986 | Bok | 118/50 |

FOREIGN PATENT DOCUMENTS

| | | |
|---|---|---|
| 0056704 | 7/1982 | European Pat. Off. . |
| 8537923 | 4/1981 | Japan . |
| 7513535 | 11/1975 | Netherlands . |

*Primary Examiner*—Michael R. Lusignan
*Attorney, Agent, or Firm*—David H. Semmes; Warren E. Olsen

[57] ABSTRACT

Improved installation (10), whereby in a first section (22) coating (24) is applied on substrate (14), moving through a passage (16) under double floating condition, in a following section (26) a layer fluid (28) is applied on said layer coating (24) and in the following sections (30) and (32) the removal takes place of said fluid layer with thereafter a drying of the remaining coating layer.

12 Claims, 11 Drawing Figures

METHOD FOR COATING SUBSTRATES

The invention relates to a method and installation for applying a coating on a flat surface.

Such method and installation are described in the Dutch Patent Application No. 82 00 753 of the applicant.

In this new Application some improvements are disclosed.

For instance, in the coating supply station the supply of a precisely measured volume of coating per second takes place towards a narrow gap in between the substrate and a very smooth applicator segment.

Thereby the flow restriction of the gap section in the direction, which is opposite to the direction of substrate displacement, is that large, that no coating can leak away in this direction.

In the next section the coating layer, applied on the substrate, is supplemented with an additional layer of thinner or other evaporizable liquid.

Next, in another section a gradual removal of this second layer takes place, and whereby the coating layer cannot come into a mechanical contact with components of the installation.

The other, non-processing side of the substrate moves along a guide wall with a fluid medium cushion in between and whereby the applied coating is separated from the wall section of the succeeding passage area, which over some distance is remote from the substrate, passing through.

This contact-free displacement is maintained until the coating in the following section is dried and whether or not hardened.

Further details follow from the description of the following Figures.

Figures 5, 6, 7, 8, 9, 10, 11:
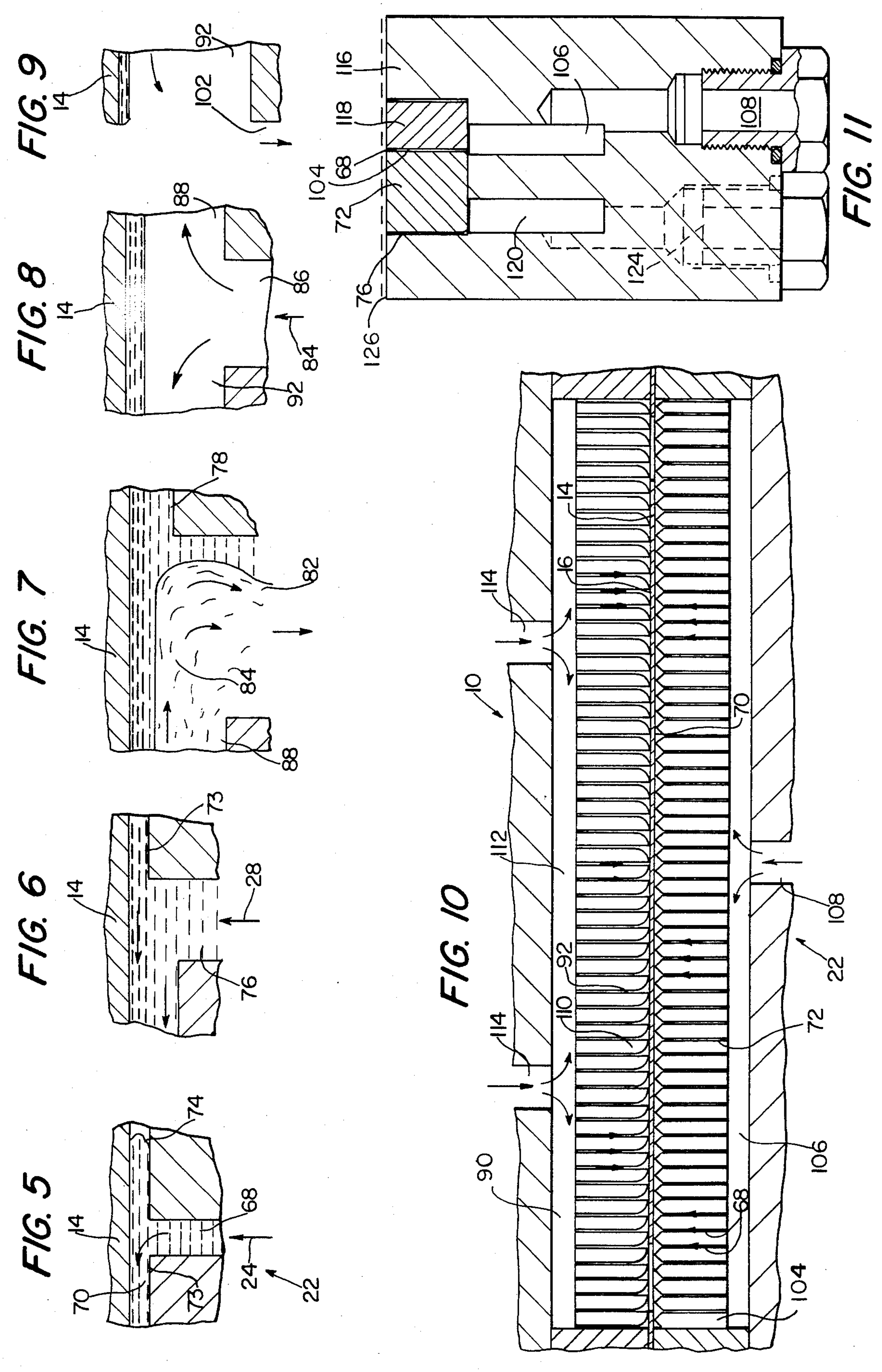

FIG. 5 discloses in detail the section for applying the coating.

FIG. 6 discloses in detail the section for applying the thinner.

FIGS. 7, 8 and 9 show in detail the removal of the thinner and the thickening of the applied coating layer.

FIG. 10 is a cross section of an installation for applying a coating at the passage area.

FIG. 11 is a cross section of the housing of the coating applicator.

Figure 1:
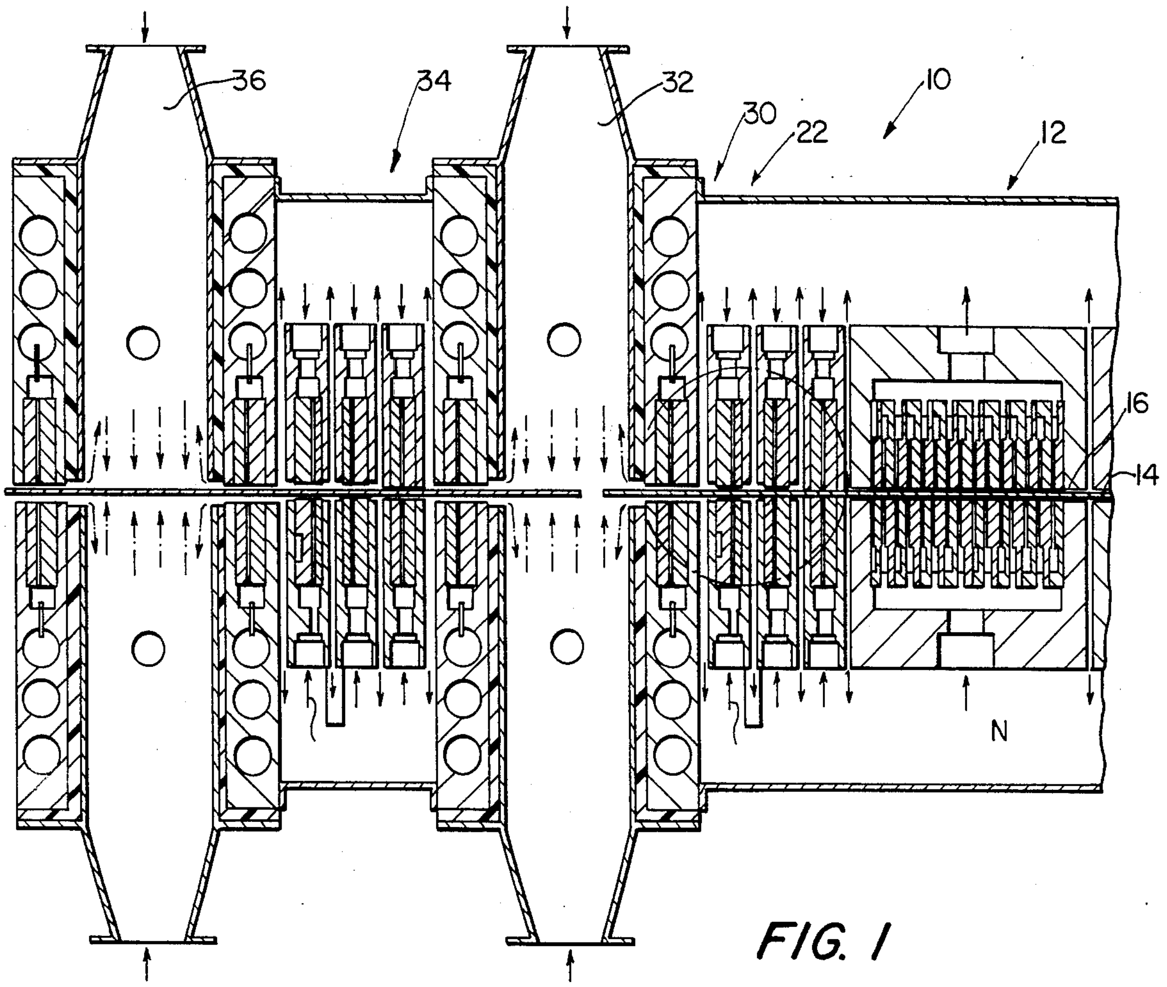
FIG. 1 is a section of a process installation, in which a coating is applied on a substrate, passing through, and whereby thereafter the coating is dried.

In FIG. 1 the installation 10 is shown. Thereby in a preceding section 12 a drying of the substrate 14 in the narrow passage 16 has taken place by means of warm gaseous medium, such as nitrogen, which is supplied through channels 18 and discharged through channels 20, see also FIG. 2.

In section 22 the applying of coating 24 on the substrate 14 takes place, and in section 26 the applying of thinner 28.

In section 30 the removal of this thinner 28 and thickening of the applied coating layer occurs, whereas in module 32, which for instance can be a micro-wave oven, a drying and hardening of the coating, applied on the substrate, takes place.

In the next section 34 a second coating layer is applied on the substrate 14, within module 36 a repeated drying and hardening of this second coating layer.

Figure 2:
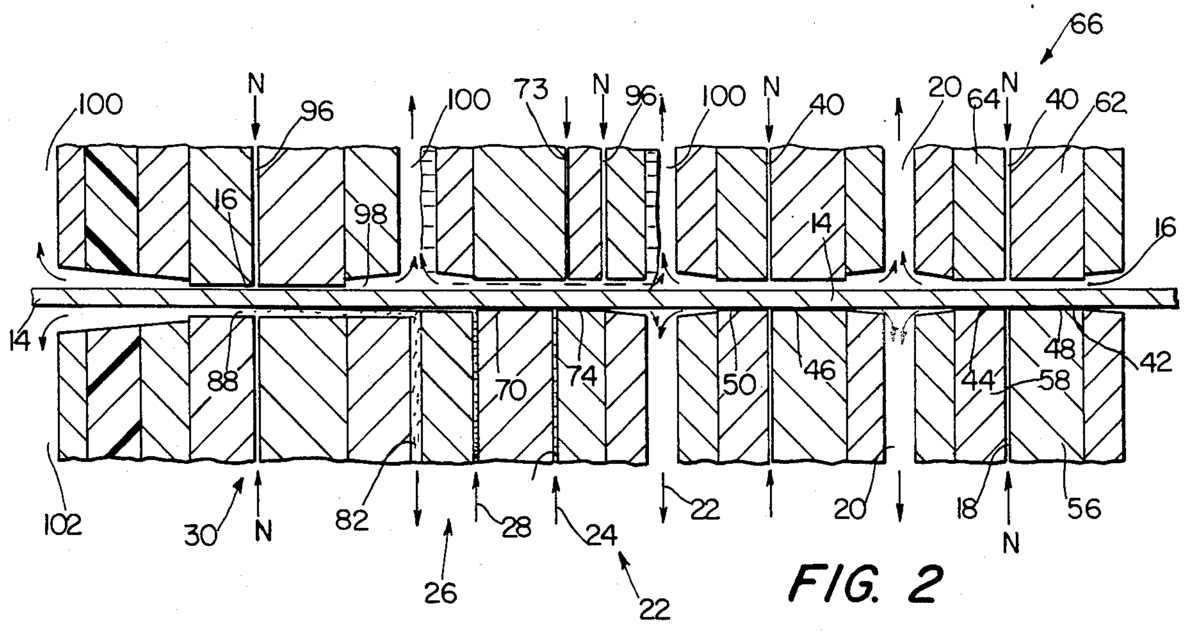
FIG. 2 is an enlarged section of the installation for applying a coating according to FIG. 1.

In FIG. 2 the section 22 for applying coating is enlarged also at the passage 16. Through successive channels 18 supply of nitrogen takes place towards the processing side of the substrate 14 and through channels 40 the supply of nitrogen towards the non-processing side of this substrate.

Thereby the extremely smooth and flat segment wall sections 42, 44 and 46 in combination with micro fluid medium cushions 48 and 50 provide a good guidance for the substrate.

Simultaneously with the nitrogen evaporated thinner can be supplied.

Through discharge channels 20 the discharge of supplied fluid medium occurs, whereby such a discharge can be connected with a high vacuum pump.

The supply channels 18 are located in between the nitrogen segments 56 and 58, which are positioned in the lower transporter section 60, whereas the supply channels 40 are located in between the segments 62 and 64 of the upper transporter section 66.

The discharge channels 20 are located in between the successive transporters.

Figure 3:
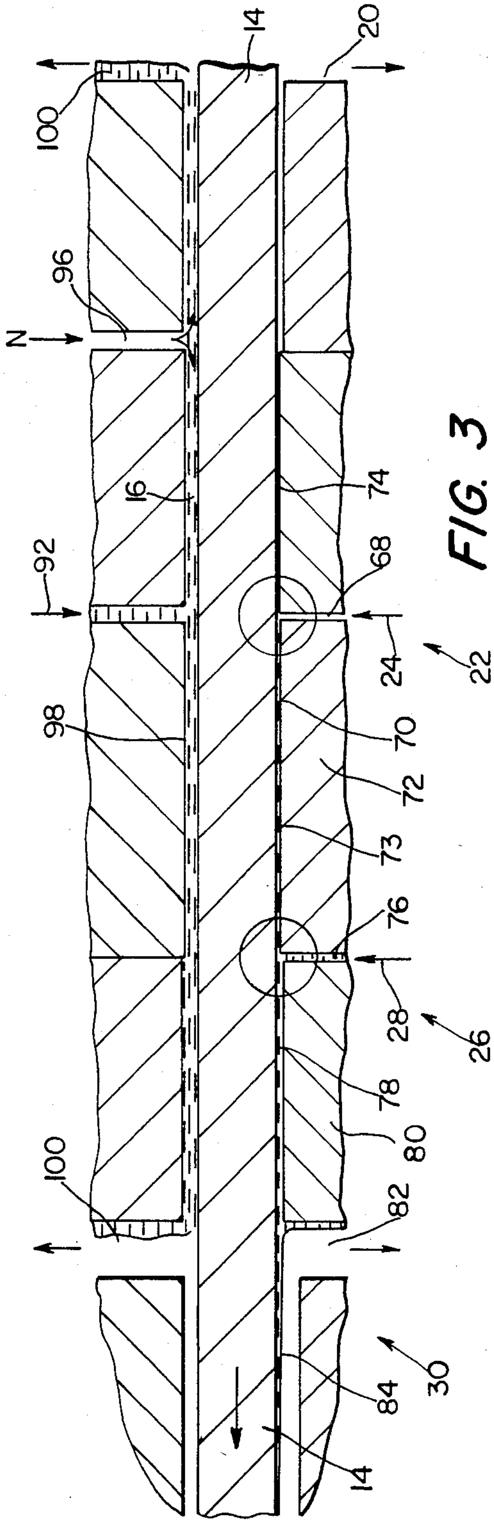
FIG. 3 is the first section of the installation according to FIG. 2.
Figure 4:
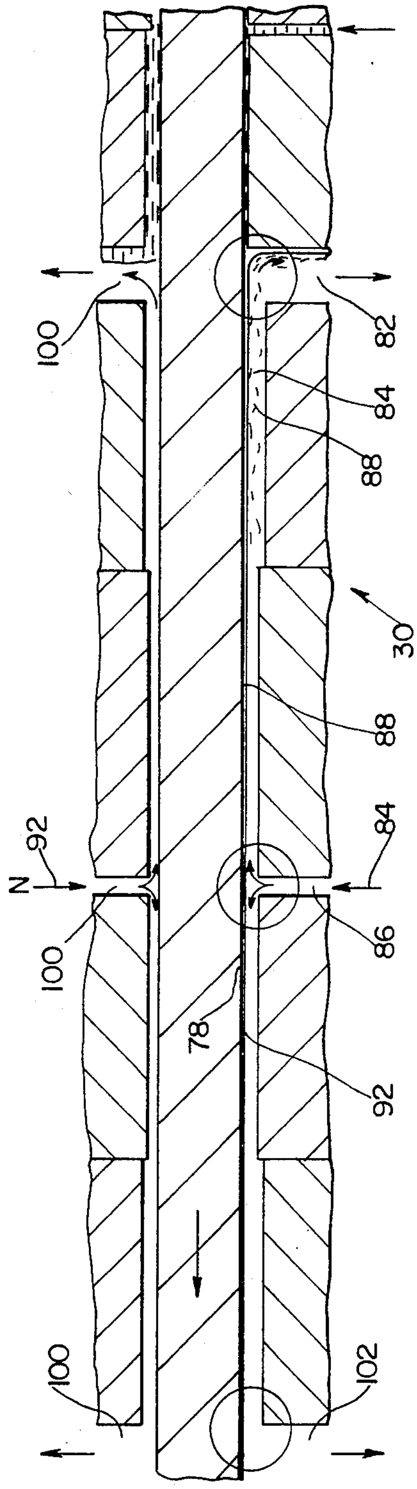
FIG. 4 is the second section of the installation according to FIG. 2.

In section 22, see also FIGS. 3 and 4, coating is supplied through a great number of supply channels 68, positioned aside each other for coating supply in precisely measured volumes per second. Thereby this coating fills the gap 70 in between segment 72 and the substrate 14.

Thereby the velocity of the coating in this gap corresponds with that of the substrate.

In gap 74 only a limited urging of coating takes place and so this gap, filled with coating, in combination with the displacement of the substrate, functions as a coating lock.

In that way by means of a coating supply of 100 $mm^3$ per minute towards a 5" substrate (wafer), displacing at 4 mm per second, a distance in upward direction of approximately 3 micrometer is maintained in between such substrate and segment 72.

Thereby the volume of coating is in relation to the thickness of the coating layer, which is wanted after hardening thereof.

Furthermore, the flow restriction of gap 70 for the coating is such large, that the gap also functions as a coating lock, with no urging of superfluous coating towards channel 76.

Only minimum coating as part of this lock is carried away by the substrate over the ultra smooth, highly polished passage wall 73 of segment 72.

Thereafter in thinner section 26 through channel 76 thinner 28 is supplied towards the gap in between the substrate 14 and segment 80, and such in a precisely measured volume per second.

This second or thinner layer prevents any deformation of the smooth surface of the applied coating layer and mixes with this layer only to a very limited extent.

Thereby the fluid medium cushions in the passage gaps above the substrate urge the substrate to rest upon the applied layers of coating and thinner.

In section 30, see also FIG. 4, the removal of thinner takes place through a great number of discharge channels 82, located aside each other. This discharge is also established by means of gaseous medium 84, which is supplied towards gap 88 through a great number of supply channels 86, positioned aside each other. Thereby this medium, whirling in this gap towards discharge 82, carries away particles of thinner, see also FIG. 7.

These warm gases, also flowing through gap 92 towards the following discharge channel 102, already dry the applied coating layer 78 to a limited extent.

The combination of thinner, supplied through channels 93, and nitrogen, which is supplied through channels 96 towards gap 98 on top of the substrate 14 near the coating supply, also serves for the removal of coating out of passage 16, if no substrate section is moving through.

Thereby such a combination of medium is continuously discharged through the upper discharge channels 100 and the lower discharge channels 20, 82 and 102.

In that way warm coating with a high percentage of solids (up to 70%) can be applied on the substrate with a perfect planarisation of "stepped" surface topography of this substrate and an extremely fast processing.

In FIGS. 10 and 11 the installation 10 is shown at the location of the coatin supply section 22. Thereby in the sidewall 104 of segment 72 the extremely narrow channels 68 are etched, the flow restriction thereof being great as compared with the flow restriction of sections of passage 70, corresponding therewith.

Through combination channel 106 the channels 68 are supplied with coating from the coating supply 108. Consequently, through each passage section approximately the same quantity of coating per second is urged towards the passage 70, with approximately the same width of such passage sections.

A change in width between the sections automatically results in considerable changes in the thrust of the coating in this section, working on the substrate.

These changes in forces by far exceed the difference in the combination of other forces, working on the substrate and the internal tension forces of these substrates.

As a result, the width of the gap 70 and consequently the thickness of the applied coating is completely independent of the following variations of the substrate conditions:

1. Tolerance in thickness;
2. Bow;
3. Variation in linear thickness (taper); and
4. Non-linear variations in thickness.

In the upper part of the installation 10 in segment 110 a great number of channels 92 are etched, through which thinner from supply 114 and through combination channel 112 is urged towards upper gap 90, to provide a cleaning of passage 16.

In FIG. 11 the segment housing 116 is shown, with therein located both segments 72 and 118. Through the respective channels 106 and 120 the channels 68 and 76, positioned in segment 72, are connected with the respective supplies 108 and 124.

After the mounting of the segments in the housing the surface 126 is machined to an ultra smooth and flat surface with a roughness, which is smaller than 0,5 micrometer. Thereby during this machining cleaning liquid is urged through channels 68 and 76.

The shown installation enables the applying of coating with a layer thickness less than 3 micrometer, and such together with extremely small and allowable differences in such thicknesses.

I claim:

1. Method for coating substrates comprising:

a. flowing gaseous medium longitudinally within a confined passageway via a series of gaseous medium supply channels and gaseous medium discharge channels intersecting the top and bottom of said passageway;

b. introducing said substrates into an end of said passageway, so as to be supported "contact-free" by said flowing gaseous medium, while c. advancing said substrates "contact-free" within said passageway by said flowing gaseous medium; and d. injecting a coating medium into said passageway via a number of branched coating medium supply channels, intersecting said passageway adjacent said gaseous medium supply channels and gaseous medium discharge channels, so as to coat said advancing substrate.

2. Method for coating substrates as in claim 1, including regulating the speed of injecting said coating medium with respect to the speed of advancing said substrate, so as to limit discharge of coating medium.

3. Method for coating substrates as in claim 2 including controlling the thickness of said coating upon the planar surface of said substrate by gauging the supply of coating through said passageway.

4. Method for coating substrates as in claim 3, including feeding coating thinner and simultaneously feeding gaseous medium into said passageway sequentially of said injecting of coating.

5. Method for coating substrates as in claim 4, wherein said thinner is an evaporizable fluid medium.

6. Method for coating substrates as in claim 5 wherein the speed of feeding said thinner is at least not considerably larger than the speed of advancing said substrate.

7. Method for coating substrates as in claim 6, including partially removing applied thinner from said substrate, sequentially of said introducing of thinner.

8. Method for coating substrates as in claim 1, includfeeding the gaseous medium upon the surface of the applied thinner.

9. Method for coating substrates as in claim 8, including warming of said gaseous medium.

10. Method for coating substrates as in claim 9, wherein said coating has a high percentage of solids.

11. Method for coating substrates as in claim 9, wherein said coating is maintained temporarily at a temperature of at least 40° C.

12. Method for coating substrates as in claim 11, including heating said longitudinal passageway.

* * * * *